(12) United States Patent
Ishizuka et al.

(10) Patent No.: US 10,886,601 B2
(45) Date of Patent: Jan. 5, 2021

(54) ELECTRONIC DEVICE

(71) Applicant: Murata Manufacturing Co., Ltd., Nagaokakyo (JP)

(72) Inventors: Kenichi Ishizuka, Nagaokakyo (JP); Takeaki Tamayama, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 89 days.

(21) Appl. No.: 16/258,869

(22) Filed: Jan. 28, 2019

(65) Prior Publication Data

US 2019/0157746 A1    May 23, 2019

Related U.S. Application Data

(63) Continuation of application No. PCT/JP2018/020746, filed on May 30, 2018.

(30) Foreign Application Priority Data

Jul. 6, 2017 (JP) .................................. 2017-132442

(51) Int. Cl.
*H01Q 1/24* (2006.01)
*H01Q 13/10* (2006.01)
(Continued)

(52) U.S. Cl.
CPC .............. *H01Q 1/243* (2013.01); *H01Q 1/48* (2013.01); *H01Q 7/00* (2013.01); *H01Q 13/10* (2013.01);
(Continued)

(58) Field of Classification Search
CPC ........ H01Q 1/243; H01Q 21/28; H01Q 13/10; H01Q 7/00; H01Q 1/48; H05K 7/20509; H04M 1/02; H04M 1/026
See application file for complete search history.

(56) References Cited

U.S. PATENT DOCUMENTS

2011/0159815 A1* 6/2011 Wu .................... H01Q 1/243
455/41.2
2014/0203992 A1 7/2014 Nakano et al.
(Continued)

FOREIGN PATENT DOCUMENTS

| CN | 1892164 A | 1/2007 |
|---|---|---|
| CN | 202855892 A | 4/2013 |

(Continued)

OTHER PUBLICATIONS

International Search Report issued for PCT/JP2018/020746, dated Aug. 7, 2018.

*Primary Examiner* — Dieu Hien T Duong
(74) *Attorney, Agent, or Firm* — Arent Fox LLP (57) ABSTRACT

An electronic device includes an antenna, and a plate-shaped heat spreader including first and second metal layers that are stacked, a working fluid in an enclosed space interposed between the first and second metal layers, and a joint along which outer peripheral portions around the enclosed space are joined. The heat spreader includes an operational region in which the enclosed space is located and a quasi-operational region other than the enclosed space. The antenna is provided in the quasi-operational region in a plan view of the heat spreader.

19 Claims, 11 Drawing Sheets

(51) Int. Cl.
  *H05K 7/20* (2006.01)
  *H01Q 7/00* (2006.01)
  *H04M 1/02* (2006.01)
  *H01Q 1/48* (2006.01)
  *H01Q 21/28* (2006.01)

(52) U.S. Cl.
  CPC .............. *H01Q 21/28* (2013.01); *H04M 1/02* (2013.01); *H05K 7/20509* (2013.01)

(56) References Cited

U.S. PATENT DOCUMENTS

2014/0360701 A1* 12/2014 Aoki .................. F28D 15/0233
                                                        165/104.21
2017/0012350 A1   1/2017 Nakano et al.
2018/0310436 A1  10/2018 Egami et al.

FOREIGN PATENT DOCUMENTS

| JP | 2006245869 A | 9/2006 |
| JP | 2015050580 A | 3/2015 |
| JP | 2016040959 A | 3/2016 |
| WO | 2014203976 A1 | 12/2014 |
| WO | 2017104790 A1 | 6/2017 |

* cited by examiner

ELECTRONIC DEVICE

CROSS REFERENCE TO RELATED APPLICATIONS

This application claims the benefit of priority to Japanese Patent Application No. 2017-132442 filed on Jul. 6, 2017 and is a Continuation Application of PCT Application No. PCT/JP2018/020746 filed on May 30, 2018. The entire contents of each application are hereby incorporated herein by reference.

BACKGROUND OF THE INVENTION

1. Field of the Invention

The present invention relates to an electronic device, and more particularly, to an electronic device that includes a heat spreader and an antenna.

2. Description of the Related Art

A communication antenna that is included in an electronic device, such as a mobile device, is typically disposed in a relatively-small-conductor-density area (for example, a non-ground area in which no ground conductor is formed) that is located near, for example, an end portion of the electronic device in the housing of the electronic device to avoid an effect of another component or another conductor adjacent thereto on communication characteristics (Japanese Unexamined Patent Application Publication No. 2016-40959).

In recent years, the heat density of such electronic devices has been increased because of the advance of integration with miniaturization, and a heat dissipation measure has become more important. Consequently, each electronic device is provided with a plate-shaped heat spreader to dissipate heat that is generated by a heating component, such as a LSI chip or a power IC, in some cases. The heat that is generated by the heating component spreads over the entire plate-shaped heat spreader and is dissipated from the entire heat spreader.

It is necessary for the plate-shaped heat spreader to have an increased area to increase the amount of heat that is dissipated by the plate-shaped heat spreader. In recent years, however, the density and integration of elements in electronic devices have been increased to fulfill a need for small, high-performance electronic devices. Consequently, it is difficult to merely increase the area of the plate-shaped heat spreader.

It may be considered that the plate-shaped heat spreader is disposed also in the relatively-small-conductor-density area that is located near an end portion of an electronic device in the housing of the electronic device to increase the area of the heat spreader. In this case, however, an antenna that is disposed in the area is affected by the heat spreader, and there is a risk that the characteristics of the antenna greatly vary.

SUMMARY OF THE INVENTION

Preferred embodiments of the present invention provide electronic devices that each enable the characteristics of an antenna to be ensured and the heat dissipation effect of a heat spreader to be improved.

An electronic device according to a preferred embodiment of the present invention includes an antenna, and a plate-shaped heat spreader including a first metal layer and a second metal layer that are stacked, a working fluid in an enclosed space interposed between the first metal layer and the second metal layer, and a joint along which outer peripheral portions around the enclosed space are joined. The heat spreader has an operational region in which the enclosed space is located and a quasi-operational region other than the enclosed space. The antenna is provided in the quasi-operational region in a plan view of the heat spreader.

With this structure, the heat spreader extends to the region in which the antenna is located, and the area of the plate-shaped heat spreader is increased. Accordingly, the heat dissipation effect of the heat spreader is able to be improved.

In an electronic device according to a preferred embodiment of the present invention, at least a portion of the quasi-operational region is preferably located in a nonconductive area having conductor density that is lower than that of the other area in a plan view of the heat spreader. The antenna is preferably provided in the portion of the quasi-operational region that is located in the nonconductive area. The nonconductive area, which has a relatively small conductor density, is suitable for heat dissipation in the electronic device. Accordingly, in the case in which the portion of the heat spreader (the quasi-operational region) is located in the nonconductive area, the heat dissipation effect of the heat spreader is able to be further improved.

In an electronic device according to a preferred embodiment of the present invention, the nonconductive area may be a non-ground area in which no ground conductor is disposed.

In an electronic device according to a preferred embodiment of the present invention, at least a portion of the operational region may be located in the nonconductive area in a plan view of the heat spreader.

In an electronic device according to a preferred embodiment of the present invention, the heat spreader may include a bent portion in the portion of the quasi-operational region that is located in the nonconductive area. The bent portion may be a portion of the antenna.

In an electronic device according to a preferred embodiment of the present invention, the heat spreader may include a notch in the portion of the quasi-operational region that is located in the nonconductive area. The notch may be a portion of the antenna.

In an electronic device according to a preferred embodiment of the present invention, the notch is preferably provided in a portion of the first metal layer that is not stacked with the second metal layer. With this structure, both of the first metal layer and the second metal layer do not include the notch. Accordingly, precise positioning of the first metal layer and the second metal layer is not required when or after the heat spreader is manufactured. Accordingly, the characteristics of the antenna are reduced or prevented from varying due to misalignment of the first metal layer and the second metal layer during or after the manufacture.

In an electronic device according to a preferred embodiment of the present invention, the antenna may be a standing-wave antenna that is used in a UHF band.

In an electronic device according to a preferred embodiment of the present invention, the electronic device may include a power supply coil that includes a coil opening. The antenna may be a magnetic-field antenna that is used in a HF band and that includes the power supply coil and the notch that overlaps the coil opening.

Electronic devices according to preferred embodiments of the present invention each enable the characteristics of an antenna to be ensured and the heat dissipation effect of a heat spreader to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will hereinafter be described with reference to the drawings. In the drawings, the same or similar components are designated by the same reference numbers. To facilitate description of main points and understandability, the preferred embodiments are separately described for convenience. However, features described according to different preferred embodiments may be partially replaced or combined. In preferred embodiments beyond a second preferred embodiment, a description of common elements, features, and aspects to those in a first preferred embodiment is omitted, and only different elements, features, and aspects will be described. In particular, the same advantageous effects achieved by the same structure are not described in all of the preferred embodiments.

First Preferred Embodiment

Figure 1:
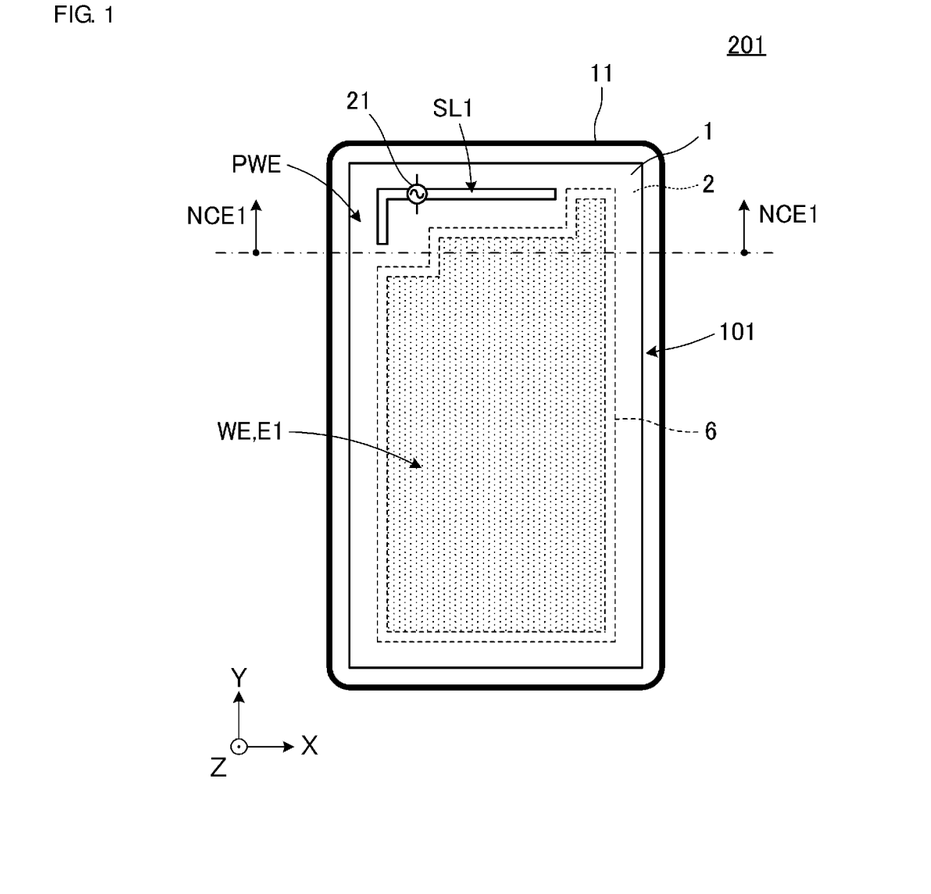
FIG. 1 is a plan view of an electronic device 201 according to a first preferred embodiment of the present invention with a cover of a housing 11 removed.
Figure 2A:
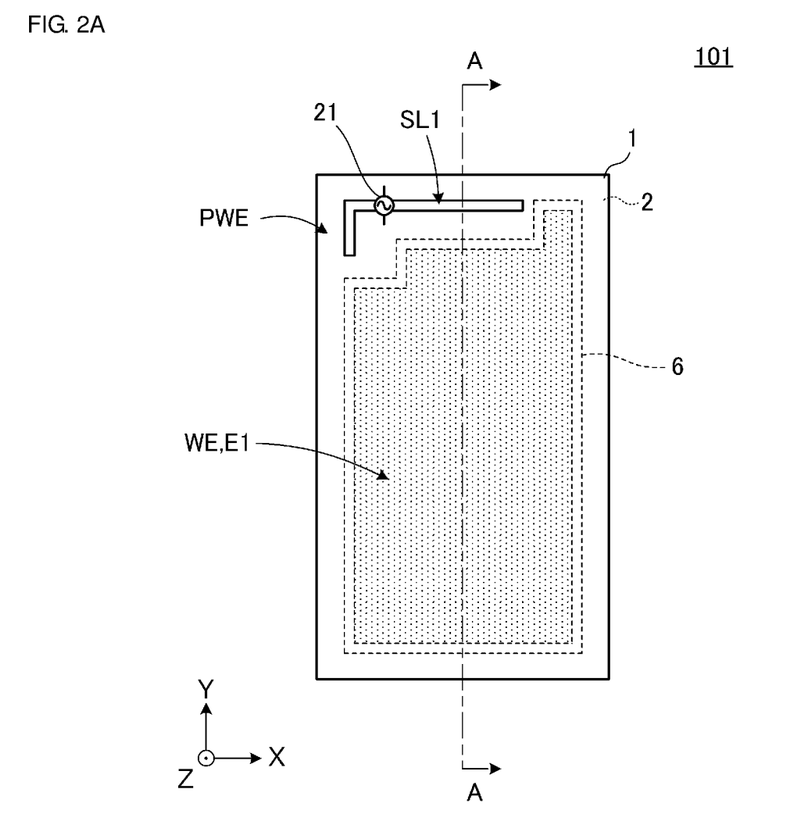
FIG. 2A is a plan view of a heat spreader 101 of the electronic device 201.
Figure 2B:
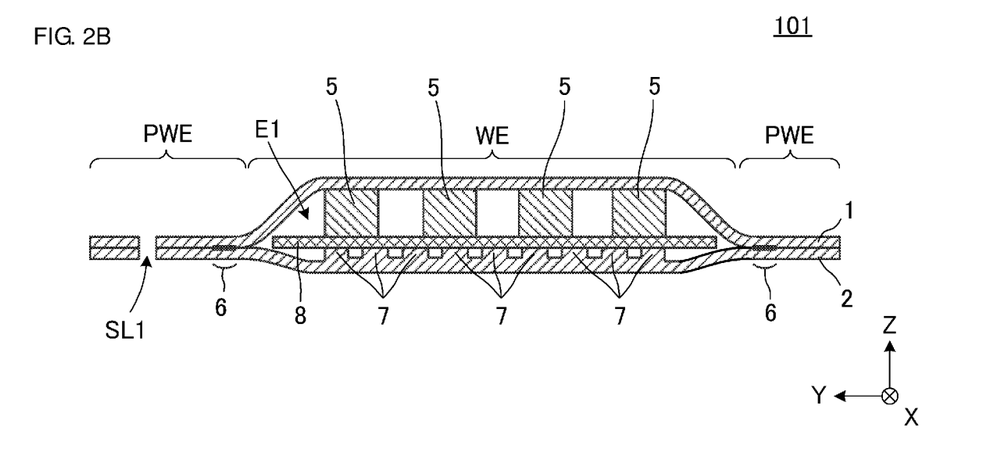
FIG. 2B is a sectional view of FIG. 2A taken along line A-A.

FIG. 1 is a plan view of an electronic device 201 according to a first preferred embodiment of the present invention with a cover of a housing 11 removed. FIG. 2A is a plan view of a heat spreader 101 of the electronic device 201. FIG. 2B is a sectional view of FIG. 2A taken along line A-A. In FIG. 1 and FIG. 2A, an operational region WE is illustrated by a dot pattern to enable structures to be easily understood.

The "electronic device" according to preferred embodiments of the present invention is a device that includes the housing, the heat spreader, and other components, and examples thereof include, for example, a cellular phone handset, a smart phone, a tablet terminal, a notebook PC, a PDA, a camera, a game console, and a toy.

The electronic device 201 includes the housing 11, the heat spreader 101, an antenna (described in detail later), and other components. The heat spreader 101 and the antenna are accommodated in the housing 11. Various substrates and an electronic component are also accommodated in the housing 11. In FIG. 1, however, illustration thereof is omitted.

The electronic device 201 has a rectangular or substantially rectangular cuboid shape, and the longitudinal direction thereof coincides with the Y-axis direction. The electronic device 201 includes a nonconductive area NCE1 having a conductor density that is lower than that of the other area in a plan view (when viewed in the Z-axis direction). The nonconductive area NCE1 is located near a first edge (the upper edge of the electronic device 201 in FIG. 1) of the electronic device 201 in the longitudinal direction. The nonconductive area NCE1 is an area in which neither the substrates including conductors nor batteries, for example, are disposed, or an area in which no ground region is provided even when the substrates are disposed. For example, the nonconductive area NCE1 is a non-ground area in which no ground conductor is formed.

The heat spreader 101 is a plate-shaped heat dissipation component that dissipates heat that is generated by a heating component (for example, a LSI chip or a power IC). As illustrated in FIG. 2A, the shape of the heat spreader 101 in a plan view is a rectangular or substantially rectangular shape, and the longitudinal direction thereof coincides with the Y-axis direction. An example of the heat spreader 101 is a vapor chamber, which is a plate-shaped heat pipe.

As illustrated in FIG. 2B, the heat spreader 101 includes a first metal layer 1, a second metal layer 2, a working fluid (not illustrated), a joint 6, pillars 5, a wick 8, and other components.

The first metal layer 1 and the second metal layer 2 are metal plates that are stacked. According to the present preferred embodiment, the first metal layer 1 and the second metal layer 2 have the same or substantially the same shape (rectangular or substantially rectangular shape), and are stacked over the entire or substantially the entire surface of each layer. Preferred examples of the first metal layer 1 and the second metal layer 2 include a metal sheet the main component of which contains Cu, Ni, Al, Ti, or Fe, or an alloy sheet the main component of which includes some of these.

As illustrated in FIGS. 2A and 2B, the heat spreader 101 includes an enclosed space E1 that is interposed between the first metal layer 1 and the second metal layer 2. Outer peripheral portions around the enclosed space E1 in a plan view are secured along the joint 6 along which the first metal layer 1 and the second metal layer are joined to each other, and the working fluid (not illustrated) is confined therein.

The first metal layer 1 and the second metal layer 2 are joined to each other by, for example, laser welding, resistance welding, diffusion welding, braze welding, TIG welding (tungsten-inert gas welding), ultrasonic welding, or resin sealing. Examples of the working fluid include water, alcohols, and an alternative CFC.

Projections 7 are provided on a surface (the main surface near the enclosed space E1) of the second metal layer 2. The projections 7 are portions that have a relatively long length in the height direction (length in the Z-axis direction) and may be portions projecting from the surface of the second metal layer 2 or may be portions that have a relatively long length in the height direction as a result of grooves (recessed portions) being provided in the surface of the second metal layer 2.

The pillars 5 are columnar components that are disposed in the enclosed space E1 to prevent the enclosed space E1 from deforming. Specifically, the pillars 5 are disposed at regular intervals in the enclosed space E1 and support the first metal layer 1 and the second metal layer 2 in the enclosed space E1. Preferred examples of the pillars 5 include a metal pillar made of Cu, Ni, Al, Mg, Ti, or Fe, or an alloy pillar the main component of which includes some of these. Each pillar 5 is preferably made of the same material as the first metal layer 1 or the second metal layer 2.

The wick 8 is a plate-shaped component that includes a capillary structure that causes the working fluid to flow through capillary action, and is disposed in the enclosed space E1. As illustrated in FIG. 2B, the wick 8 is disposed between the pillars 5 and the projections 7. Accordingly, fine grooves are provided between the wick 8 and the projections 7. For example, the capillary structure of the wick 8 may preferably be a fine structure that includes irregularities such as narrow holes, grooves, or projections, examples of which include a fiber structure, a groove structure, and a mesh structure.

As illustrated in FIGS. 2A and 2B, the heat spreader 101 includes an operational region WE in which the enclosed space E1 is located and a quasi-operational region PWE, which is a region other than the enclosed space E1. In the operational region WE, the working fluid is confined in the enclosed space E1, and the operational region WE has a great heat dissipation ability. In the quasi-operational region PWE, only the metal layers are included.

As illustrated in FIG. 1, at least a portion of the quasi-operational region PWE is located in the nonconductive area NCE1 in a plan view of the heat spreader 101 (when viewed in the Z-axis direction). At least a portion of the operational region WE is located in the nonconductive area NCE1 when viewed in the Z-axis direction.

An antenna according to a preferred embodiment of the present invention is provided in the portion of the quasi-operational region PWE that is located in the nonconductive area NCE1 when viewed in the Z-axis direction. Specifically, the heat spreader 101 includes a notch SL1 in the portion of the quasi-operational region PWE that is located in the nonconductive area NCE1. The notch SL1 is preferably an L-shaped through-hole that extends through the first metal layer 1 and the second metal layer 2 that are stacked. The notch SL1 is located near a first side (the upper side of the heat spreader 101 in FIG. 1) of the heat spreader 101 in the longitudinal direction. A power supply circuit 21 is connected at a predetermined position of the notch SL1. Consequently, a slot antenna is provided such that the notch SL1 and the vicinity thereof define and function as a radiating element (a portion of the antenna).

The electronic device 201 according to the present preferred embodiment provides the following advantageous effects.

According to the present preferred embodiment, the antenna is provided in a portion (quasi-operational region PWE) of the heat spreader 101. With this structure, the heat spreader extends to the region in which the antenna is located, and the area of the plate-shaped heat spreader is increased. Accordingly, the heat dissipation effect of the heat spreader is improved.

According to the present preferred embodiment, at least the portion of the quasi-operational region PWE and the portion of the operational region WE of the heat spreader 101 are located in (extend to) the nonconductive area NCE1 when viewed in the Z-axis direction. The nonconductive area NCE1, which has a relatively small conductor density, is suitable for heat dissipation in the electronic device. Accordingly, in the case in which at least the portion of the quasi-operational region PWE and the portion of the operational region WE of the heat spreader 101 are located in the nonconductive area NCE1, the heat dissipation effect of the heat spreader 101 is further improved.

The heat spreader 101 according to the present preferred embodiment includes the projections 7 on the inner main surface thereof (the surface of the second metal layer 2 near the enclosed space E1) that faces the enclosed space E1. With this structure, the working fluid remains between the projections 7, and the amount of the working fluid in the enclosed space E1 is increased. Accordingly, this structure enables the heat spreader to dissipate a large amount of heat (amount of heat transport). In the case in which the fine grooves are provided between the wick 8 and the projections 7, the capillary action between the wick 8 and the second metal layer 2 is improved, and the heat dissipation efficiency (heat transport efficiency) of the heat spreader is increased.

Second Preferred Embodiment

In an example provided according to a second preferred embodiment of the present invention, an electronic device includes two antennas.

Figure 3:
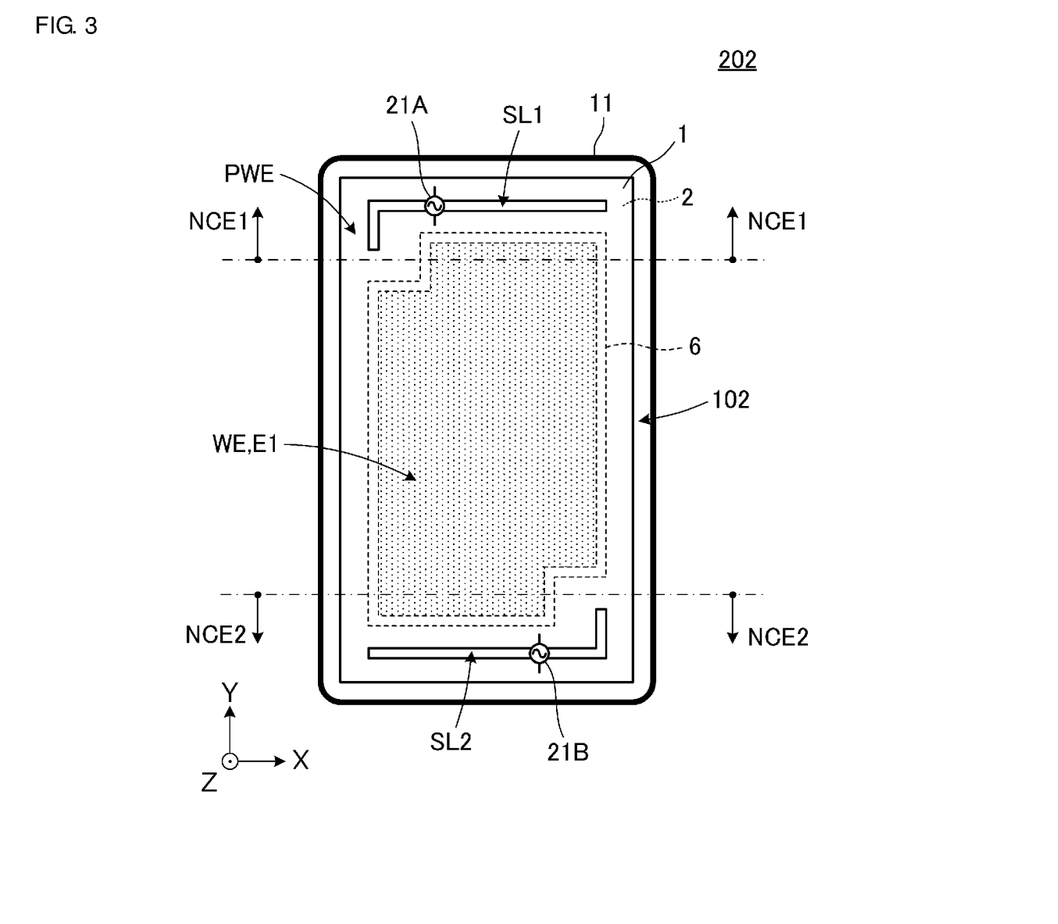
FIG. 3 is a plan view of an electronic device 202 according to a second preferred embodiment of the present invention with the cover of the housing 11 removed.

FIG. 3 is a plan view of an electronic device 202 according to the second preferred embodiment with the cover of the housing 11 removed. In FIG. 3, the operational region WE is illustrated by a dot pattern to enable structures to be easily understood.

The electronic device 202 includes the housing 11, a heat spreader 102, the two antennas (described in detail later), and other components.

The electronic device 202 differs from the electronic device 201 according to the first preferred embodiment in that it includes two nonconductive areas NCE1 and NCE2 when viewed in the Z-axis direction. The electronic device 202 also differs from the electronic device 201 in that it includes the two antennas. The remaining structure of the electronic device 202 is the same or substantially the same as in the electronic device 201.

Differences from the electronic device 201 according to the first preferred embodiment will now be described.

The nonconductive area NCE1 is located near a first edge (the upper edge of the electronic device 202 in FIG. 3) of the electronic device 202 in the longitudinal direction. The nonconductive area NCE2 is located near a second edge (the lower edge of the electronic device 202 in FIG. 3) of the electronic device 202 in the longitudinal direction.

As illustrated in FIG. 3, at least portions of the quasi-operational region PWE and portions of the operational region WE of the heat spreader 102 are located in the nonconductive areas NCE1 and NCE2 when viewed in the Z-axis direction.

The two antennas according to the present preferred embodiment are provided in the portions of the quasi-operational region PWE that are located in the nonconductive areas NCE1 and NCE2 when viewed in the Z-axis direction.

Specifically, the heat spreader 102 includes the notch SL1 in the portion of the quasi-operational region PWE that is located in the nonconductive area NCE1 and includes a notch SL2 in the portion of the quasi-operational region PWE that is located in the nonconductive area NCE2. The notches SL1 and SL2 are preferably L-shaped through-holes that extend through the first metal layer 1 and the second metal layer that are stacked. The notch SL1 is located near a first side (the upper side of the heat spreader 102 in FIG. 3) of the heat spreader 102 in the longitudinal direction. The notch SL2 is located near a second side (the lower side of the heat spreader 102 in FIG. 3) of the heat spreader 102 in the longitudinal direction. A power supply circuit 21A is connected at a predetermined position of the notch SL1. Consequently, a slot antenna is provided such that the notch SL1 and the vicinity thereof define and function as a radiating element (a portion of the antenna). A power supply circuit 21B is connected at a predetermined position of the notch SL2. Consequently, a slot antenna is provided such that the notch SL2 and the vicinity thereof define and function as a radiating element (a portion of the antenna).

As described according to the present preferred embodiment, the electronic device may include a plurality of the antennas.

Third Preferred Embodiment

In an example provided according to a third preferred embodiment of the present invention, a notch has a different shape.

Figure 4:
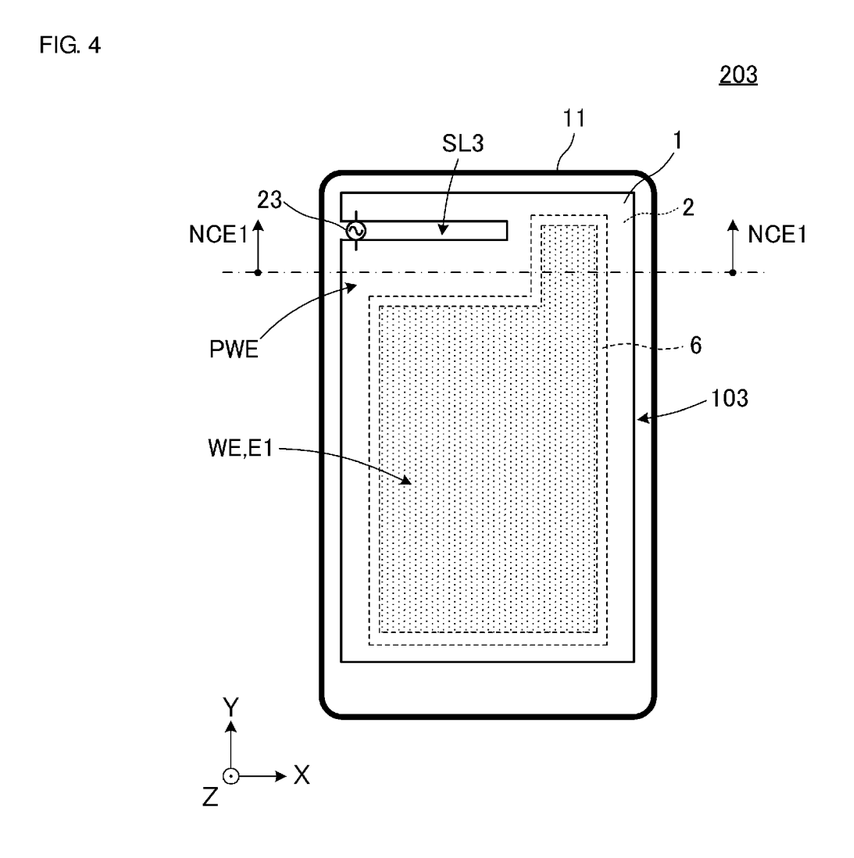
FIG. 4 is a plan view of an electronic device 203 according to a third preferred embodiment of the present invention with the cover of the housing 11 removed.

FIG. 4 is a plan view of an electronic device 203 according to the third preferred embodiment with the cover of the housing 11 removed. In FIG. 4, the operational region WE is illustrated by a dot pattern to enable structures to be easily understood.

A heat spreader 103 according to the present preferred embodiment differs from the heat spreader 101 according to the first preferred embodiment in that the notch has a different shape. The remaining structure of the electronic device 203 is the same or substantially the same as in the electronic device 201 according to the first preferred embodiment.

Differences from the electronic device 201 according to the first preferred embodiment will now be described.

The heat spreader 103 includes a notch SL3 in the portion of the quasi-operational region PWE that is located in the nonconductive area NCE1. The notch SL3 is a slit that extends inward (in the +X direction) from an outer edge of the heat spreader 103 and is located near a first side (the upper side of the heat spreader 103 in FIG. 3) of the heat spreader 103 in the longitudinal direction. A power supply circuit 23 is connected by using, for example, a balun at a predetermined position of the notch SL3. Consequently, a slot antenna is provided such that the notch SL3 and the vicinity thereof define and function as a radiating element (a portion of the antenna).

As described according to the present preferred embodiment, the antenna may be defined by the slit (notch) that extends inward from the outer edge of the heat spreader.

Fourth Preferred Embodiment

In an example provided according to a fourth preferred embodiment of the present invention, a notch has a difference structure.

Figure 5:
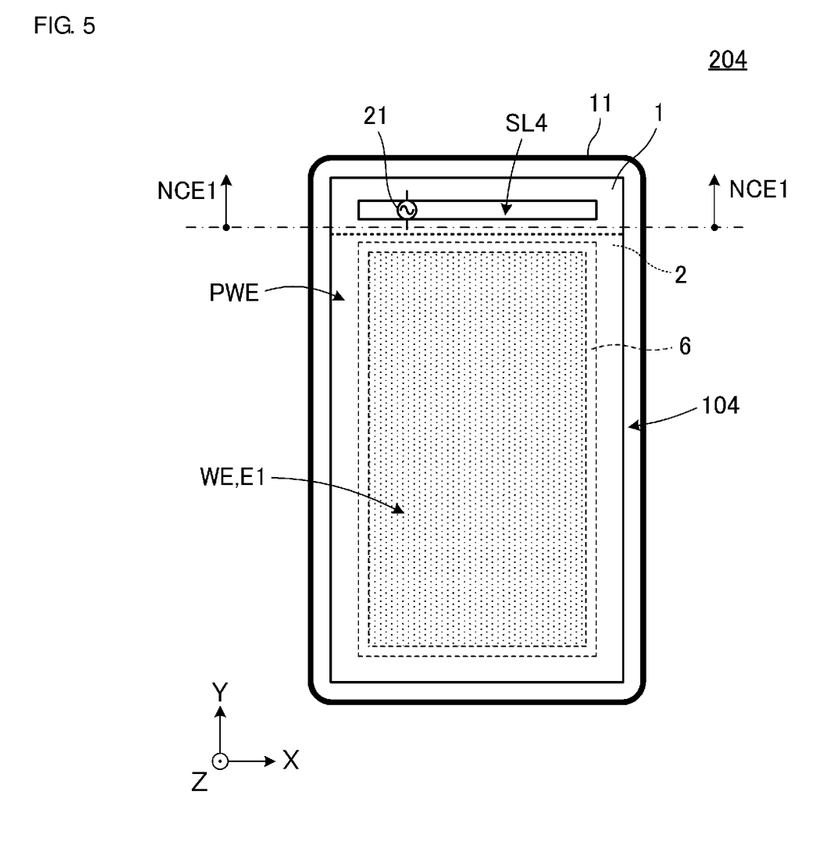
FIG. 5 is a plan view of an electronic device 204 according to a fourth preferred embodiment of the present invention with the cover of the housing 11 removed.
Figure 6A:
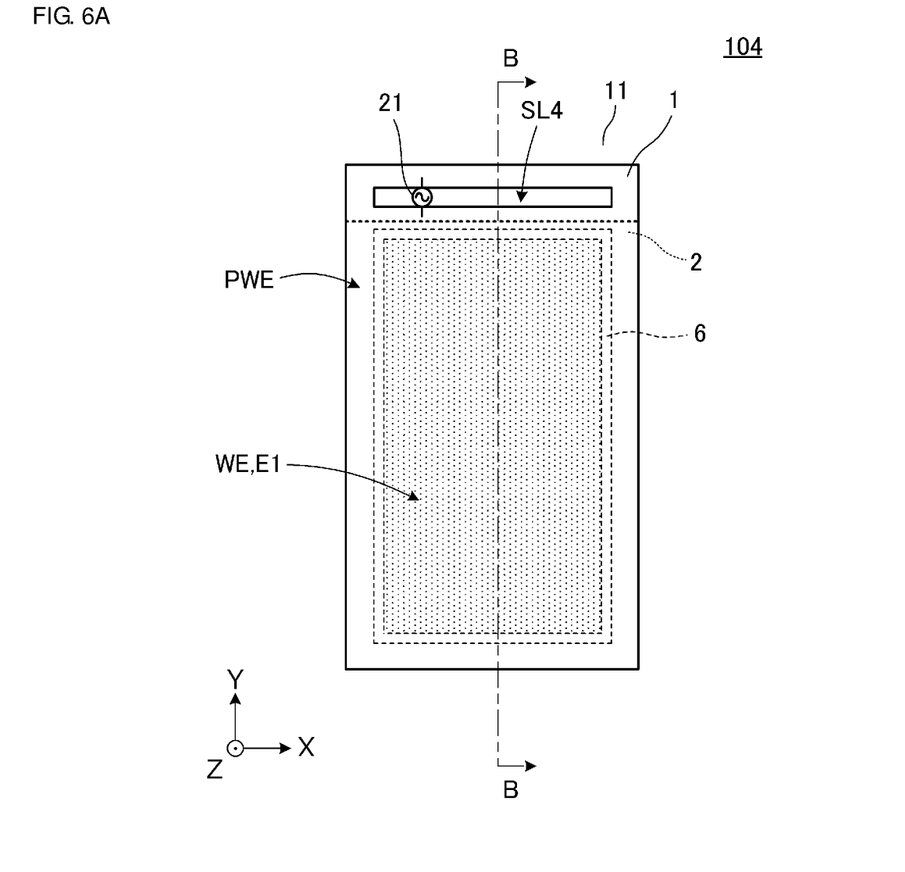
FIG. 6A is a plan view of a heat spreader 104 according to the fourth preferred embodiment of the present invention.
Figure 6B:
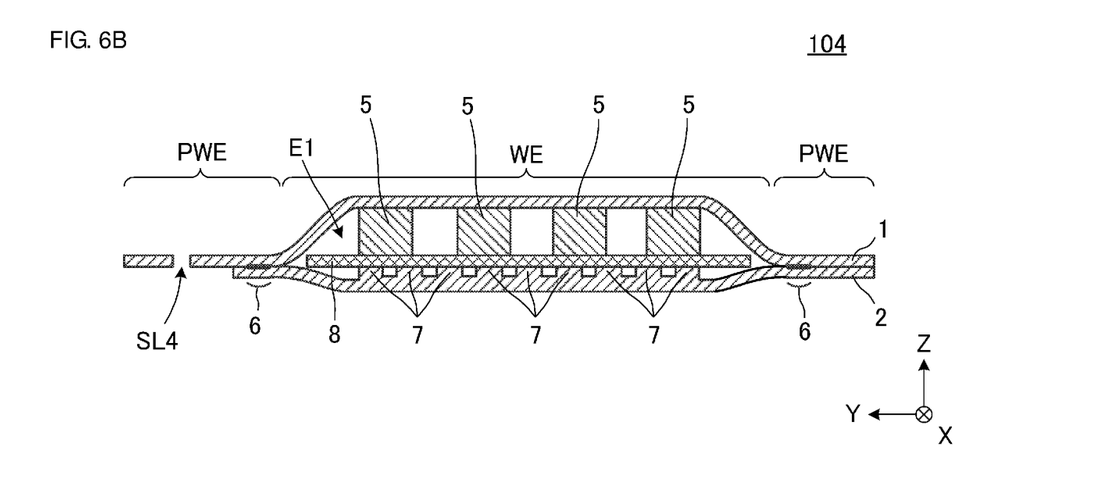
FIG. 6B is a sectional view of FIG. 6A taken along line B-B.

FIG. 5 is a plan view of an electronic device 204 according to the fourth preferred embodiment with the cover of the housing 11 removed. FIG. 6A is a plan view of a heat spreader 104 according to the fourth preferred embodiment. FIG. 6B is a sectional view of FIG. 6A taken along line B-B. In FIG. 5 and FIG. 6A, the operational region WE is illustrated by a dot pattern to make structures easy to understand.

The notch of the heat spreader 104 according to the present preferred embodiment has a shape that differs from that in the heat spreader 101 according to the first preferred embodiment. The second metal layer 2 of the heat spreader 104 has a size that differs from that in the heat spreader 101. The remaining structure of the electronic device 203 is the same or substantially the same as in the electronic device 201 according to the first preferred embodiment.

The differences from the electronic device 201 according to the first preferred embodiment will now be described.

The second metal layer 2 according to the present preferred embodiment has an area smaller than that of the first metal layer 1. Accordingly, as illustrated in 6B, a portion of the first metal layer 1 is not stacked with the second metal layer 2.

The heat spreader 104 includes a notch SL4 in the portion of the quasi-operational region PWE that is located in the nonconductive area NCE1. The notch SL4 is a linear through-hole that is provided in the portion of the first metal layer 1 that is not stacked with the second metal layer 2. The notch SL4 is located near a first side (the upper side of the heat spreader 104 in FIG. 6A) of the heat spreader 104 in the longitudinal direction. The power supply circuit 21 is connected at a predetermined position of the notch SL1. Consequently, a slot antenna is provided such that the notch SL1 defines and functions as a radiating element (a portion of the antenna).

The electronic device 204 according to the present preferred embodiment provides the following advantageous effects in addition to the advantageous effects described according to the first preferred embodiment.

According to the present preferred embodiment, the notch SL4 is provided in the portion of the first metal layer 1 that is not stacked with the second metal layer 2. With this structure, both of the first metal layer 1 and the second metal layer 2 do not include the notch SL4. Accordingly, precise positioning of the first metal layer 1 and the second metal layer 2 is not required when or after the heat spreader is manufactured. That is, the notch SL4 is able to be provided with the intended shape, and precise positioning of the first metal layer 1 and the second metal layer 2 is not required to stack the first metal layer 1 and the second metal layer 2. Accordingly, this structure reduces or prevents the characteristics of the antenna (slot antenna) from varying due to misalignment of the first metal layer 1 and the second metal layer 2 during or after the manufacture. In addition, this structure enables the notch to be provided more readily than in the case in which the notch is provided in a portion of the first metal layer 1 and a portion of the second metal layer 2 that are stacked.

According to the present preferred embodiment, as illustrated in FIG. 5 and FIG. 6A, the shape of the enclosed space E1 (operational region WE) in a plan view is rectangular or substantially rectangular. This structure enables the outer peripheral portions around the enclosed space E1 to be joined to each other more readily than in the case in which the shape of the enclosed space E1 in a plan view is complex (for example, a polygonal shape) and facilitates manufacture of the heat spreader.

As described according to the present preferred embodiment, the first metal layer 1 and the second metal layer 2 of the heat spreader may not have substantially the same shape and may not be stacked over the entire or substantially the entire surface of each layer.

Fifth Preferred Embodiment

In an example described according to a fifth preferred embodiment of the present invention, an antenna is not a slot antenna.

Figure 7:
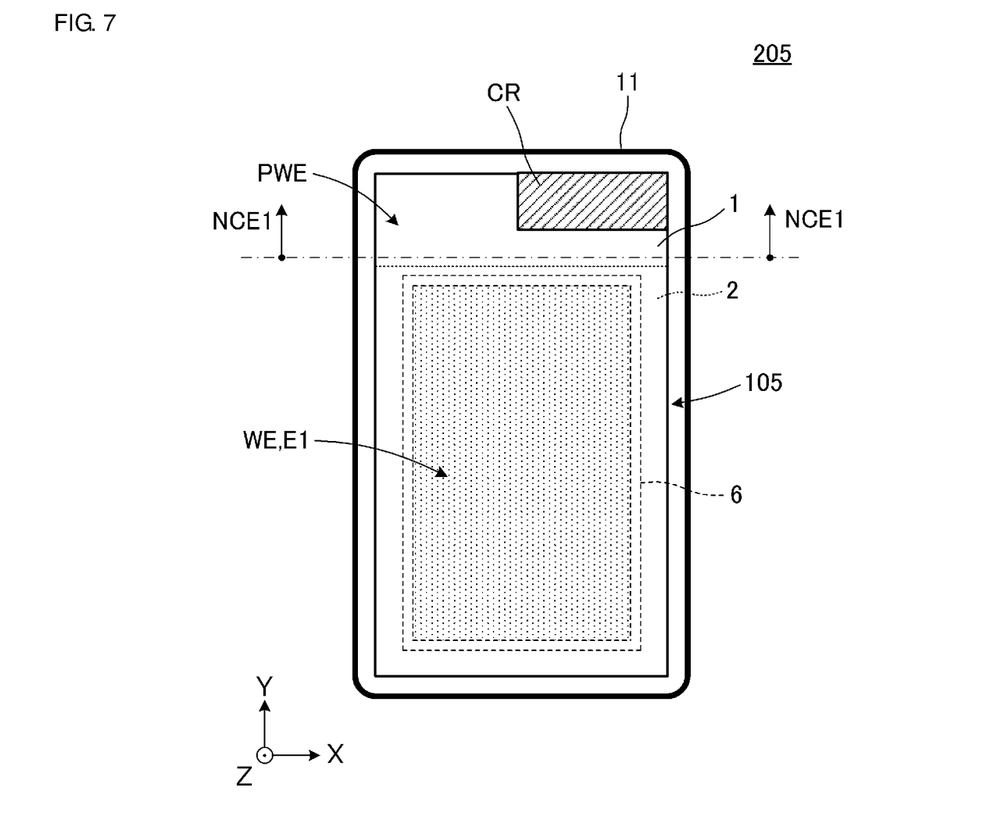
FIG. 7 is a plan view of an electronic device 205 according to a fifth preferred embodiment of the present invention with the cover of the housing 11 removed.
Figure 8A:
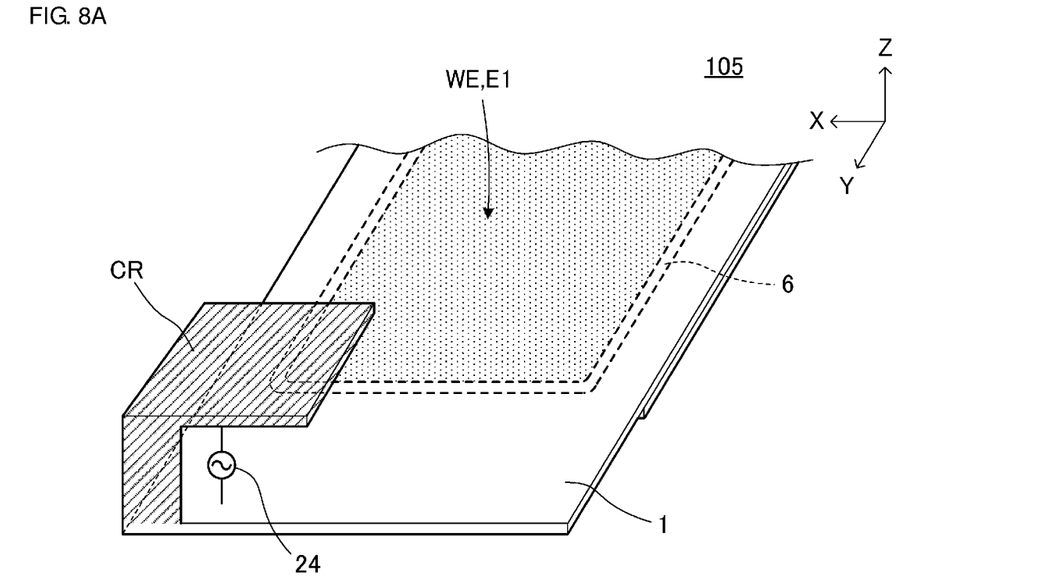
FIG. 8A is a perspective view of the appearance of a heat spreader 105 according to the fifth preferred embodiment of the present invention.
Figure 8B:
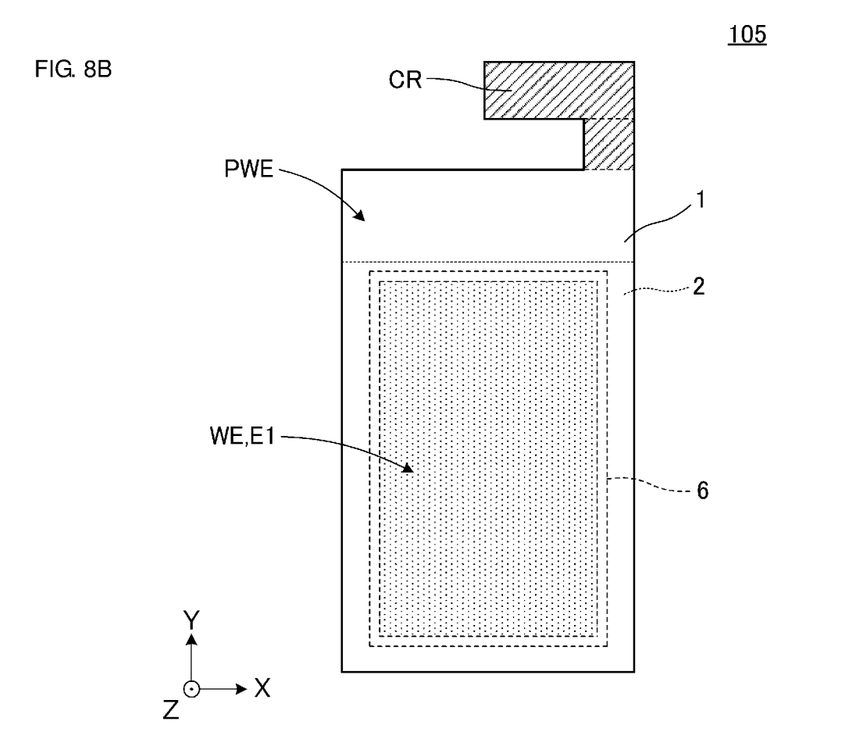
FIG. 8B illustrates an orthographic projection of the heat spreader 105.

FIG. 7 is a plan view of an electronic device 205 according to the fifth preferred embodiment with the cover of the housing 11 removed. FIG. 8A is a perspective view of the appearance of a heat spreader 105 according to the fifth preferred embodiment. FIG. 8B illustrates an orthographic projection of the heat spreader 105. In FIG. 7, FIG. 8A, and FIG. 8B, to enable structures to be easily understood, a bent portion CR is illustrated by hatching, and the operational region WE is illustrated by a dot pattern.

The heat spreader 105 according to the present preferred embodiment differs from the heat spreader 101 according to the first preferred embodiment in including the bent portion CR. The remaining structure of the electronic device 205 is the same or substantially the same as in the electronic device 201.

Differences from the electronic device 201 according to the first preferred embodiment will now be described.

The heat spreader 105 includes the bent portion CR in the portion of the quasi-operational region PWE that is located in the nonconductive area NCE1. As illustrated in FIG. 8B, the bent portion CR is provided on a first side (the upper side of the heat spreader 105 in FIG. 8B) of the heat spreader 105 in the longitudinal direction and is obtained by bending an L-shaped member. Specifically, the bent portion CR is folded, and a portion of the bent portion CR and a portion of the heat spreader 105 are parallel or substantially parallel to each other. Accordingly, the portion of the bent portion CR and the portion of the heat spreader 105 face each other. A power supply circuit 24 is connected at a predetermined position of the bent portion CR. Consequently, a PIFA (planar inverted-F) antenna is provided such that the bent portion CR defines and functions as a radiating element (a part of the antenna). An example of the antenna according to the present preferred embodiment is a standing-wave antenna that is used in a UHF band.

As described according to the present preferred embodiment, the antenna may be provided by using the bent portion CR that is obtained by bending the quasi-operational region PWE of the heat spreader.

Sixth Preferred Embodiment

In an example described according to a sixth preferred embodiment of the present invention, an electronic device includes a power supply coil.

Figure 9:
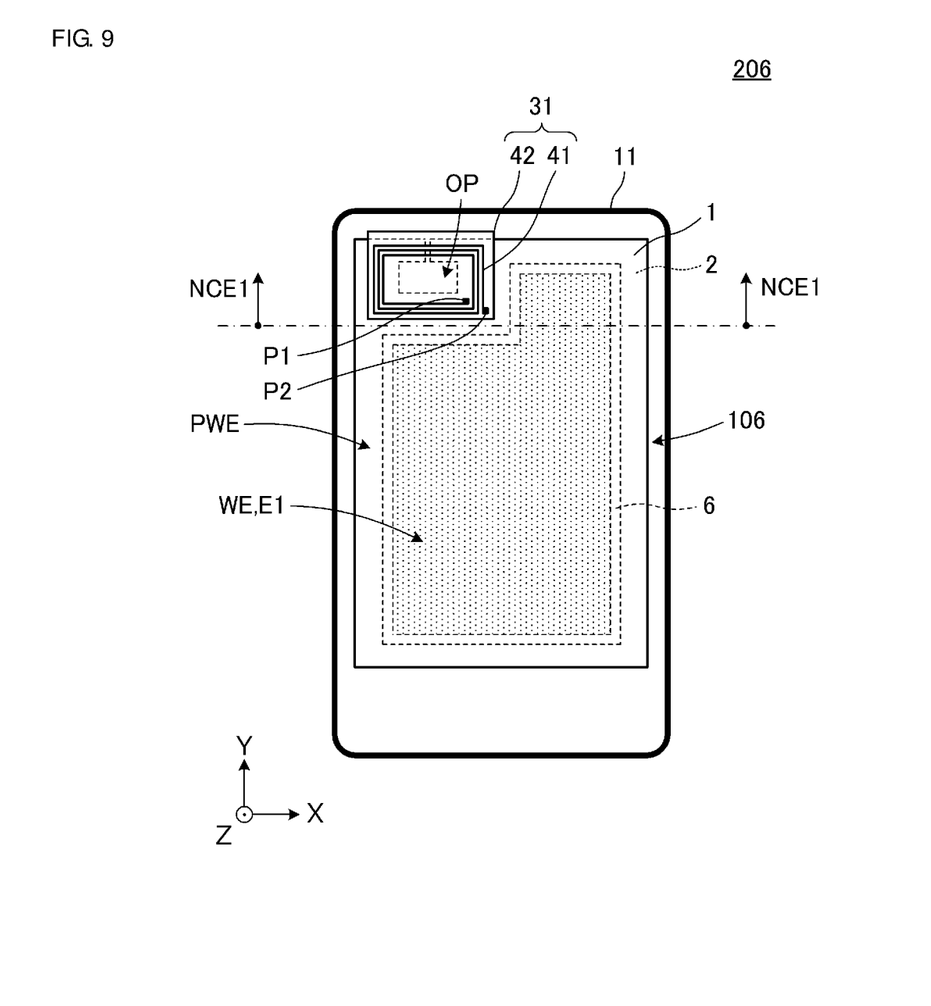
FIG. 9 is a plan view of an electronic device 206 according to a sixth preferred embodiment of the present invention with the cover of the housing 11 removed.
Figure 10A:
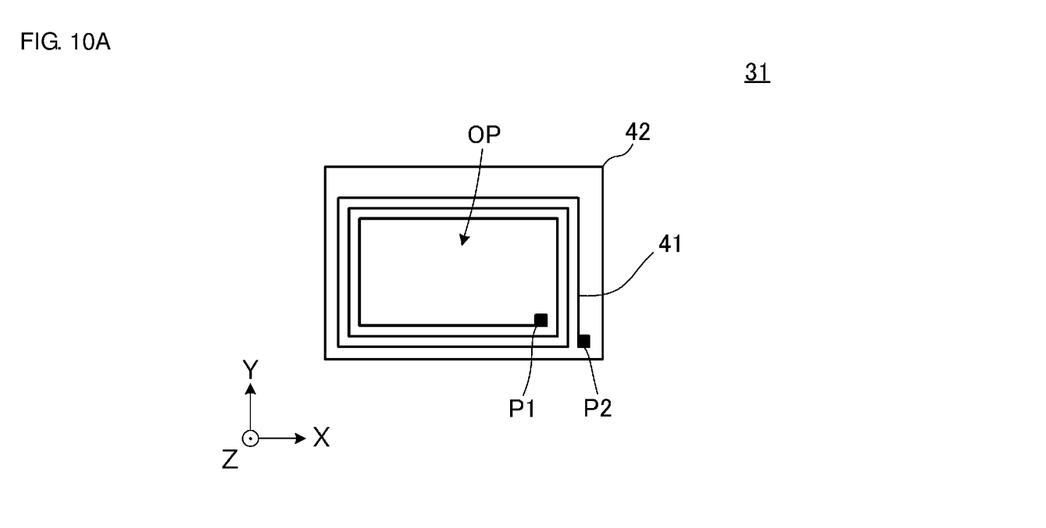
FIG. 10A is a plan view of a power supply coil 31 according to the sixth preferred embodiment of the present invention.
Figure 10B:
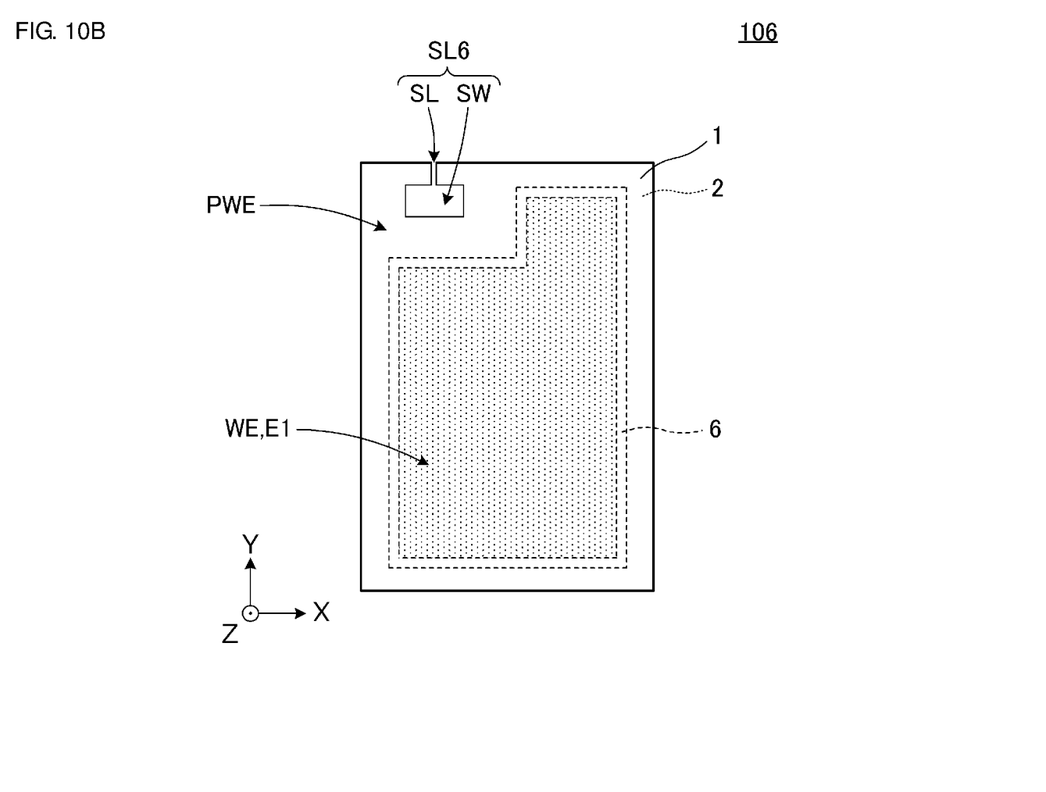
FIG. 10B is a plan view of a heat spreader 106 according to the sixth preferred embodiment of the present invention.

FIG. 9 is a plan view of an electronic device 206 according to the sixth preferred embodiment with the cover of the housing 11 removed. FIG. 10A is a plan view of a power supply coil 31 according to the sixth preferred embodiment. FIG. 10B is a plan view of a heat spreader 106 according to the sixth preferred embodiment. In FIG. 9 and FIG. 10B, the operational region WE is illustrated by a dot pattern to make structures easy to understand.

The electronic device 206 differs from the electronic device 201 according to the first preferred embodiment in including the power supply coil 31. The notch of the heat spreader 106 has a shape that differs from that in the heat spreader according to the first preferred embodiment. The remaining structure of the electronic device 206 differs from that in the electronic device 201.

Differences from the electronic device 201 according to the first preferred embodiment will now be described.

The power supply coil 31 includes a base 41, a coil conductor 42, and electrodes P1 and P2. The power supply coil 31 includes a coil opening OP.

The base 41 is preferably, for example, a rectangular or substantially rectangular plate made of an insulating material. Examples of the base 41 include a resin sheet, such as a polyimide (PI) sheet or a liquid-crystal polymer (LCP) sheet.

The coil conductor 42 is provided on a main surface of the base 41 and is a rectangular or substantially rectangular, spiral conductor pattern including about three turns, and the longitudinal direction thereof coincides with the X-axis direction. The electrodes P1 and P2 are rectangular or substantially rectangular conductor patterns that are provided on the main surface of the base 41. The electrode P1 is connected to a first edge of the coil conductor 42. The electrode P2 is connected to a second edge of the coil conductor 42. The electrodes P1 and P2 are connected to a power supply circuit not illustrated. Examples of the coil conductor 42 and the electrodes P1 and P2 include a conductor pattern, such as a Cu foil pattern, for example.

The heat spreader 106 includes a notch SL6 in the portion of the quasi-operational region PWE that is located in the nonconductive area NCE1. The notch SL6 includes a rectangular or substantially rectangular cavity SW that is provided in the quasi-operational region PWE and a linear slit SL that extends from an outer edge of the heat spreader 106 to the cavity SW (in the −Y direction). As illustrated in FIG. 10B, the line width (the width in the X-axis direction) of the slit SL is narrower than that of the cavity SW. The notch SL6 is located near a first side (the upper side of the heat spreader 106 in FIG. 10B) of the heat spreader 106 in the longitudinal direction.

As illustrated in FIG. 9, the coil opening OP of the power supply coil 31 overlaps the notch SL6 (the cavity SW).

An antenna according to the present preferred embodiment includes the power supply coil 31 and the notch SL6 that overlaps the coil opening OP of the power supply coil 31. An example of the antenna according to the present preferred embodiment is a magnetic-field antenna that is used in a HF band.

Specifically, the power supply coil 31 and the heat spreader 106 are coupled with each other with a magnetic field interposed therebetween. When electric current flows into the coil conductor 42, the electric current is induced to the cavity SW of the heat spreader 106 via an electric field, a magnetic field, or an electromagnetic field. That is, an induced current is produced at a position at which the coil conductor 42 and the heat spreader 106 are close to each other and flows in a direction in which the induced current cancels the electric current that flows into the coil conductor 42. The induced current flows through an outer peripheral portion of the heat spreader 106 due to an edge effect. The heat spreader 106 thus defines and functions as a booster antenna of the power supply coil 31.

The antenna may be provided by using the notch and power supply coil of the heat spreader.

In the electronic device 206 according to the present preferred embodiment, the coil opening OP of the power supply coil 31 overlaps the notch SL6 when viewed in the direction of a winding axis of the power supply coil 31 (when viewed in the Z-axis direction). This structure enables a portion (quasi-operational region PWE) of the heat spreader 106 to be unlikely to prevent formation of the magnetic field of the power supply coil 31.

Figure 11A:
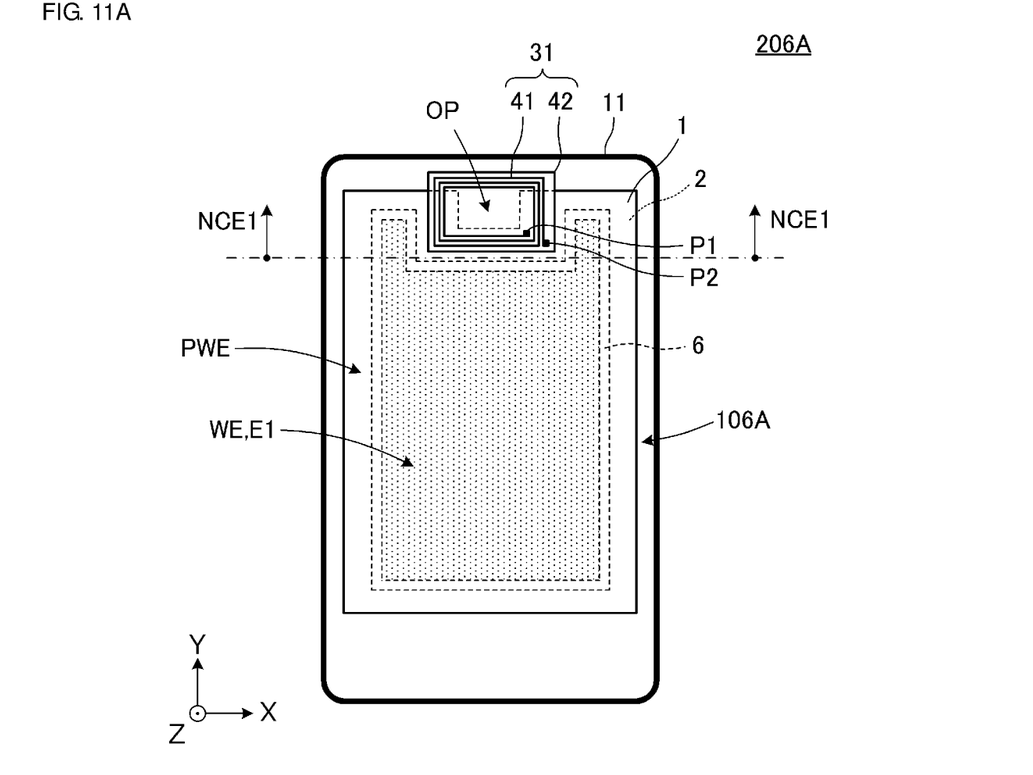
FIG. 11A is a plan view of another electronic device 206A according to the sixth preferred embodiment of the present invention with the cover of the housing 11 removed.
Figure 11B:
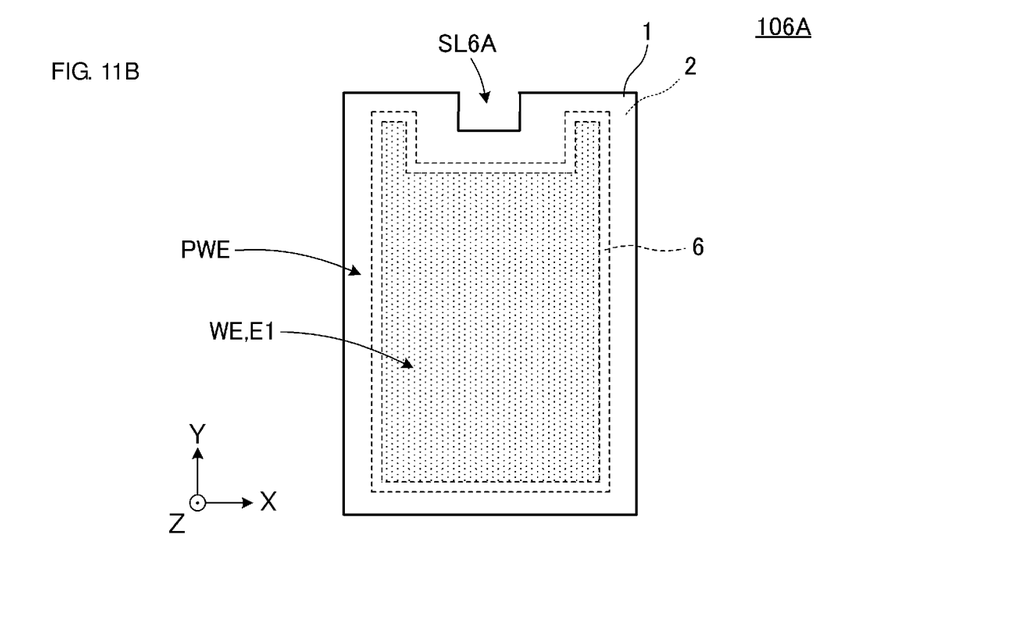
FIG. 11B is a plan view of a heat spreader 106A of the electronic device 206A.

Another electronic device according to the sixth preferred embodiment will now be described with reference to the drawings. FIG. 11A is a plan view of another electronic device 206A according to the sixth preferred embodiment with the cover of the housing 11 removed. FIG. 11B is a plan view of a heat spreader 106A of the electronic device 206A. In FIGS. 11A and 11B, the operational region WE is illustrated by a dot pattern.

The notch of the heat spreader 106A has a shape that differs from that in the above-described heat spreader 106. The remaining structure of the electronic device 206A is the same or substantially the same as in the above-described electronic device 206.

Differences from the electronic device 206 will now be described.

The heat spreader 106A includes a notch SL6A in the portion of the quasi-operational region PWE that is located in the nonconductive area NCE1. The notch SL6A is a rectangular or substantially rectangular slit that extends inward (in the −Y direction) from an outer edge of the heat spreader 106. The notch SL6A is located near a first side (the upper side of the heat spreader 106 in FIG. 11B) of the heat spreader 106A in the longitudinal direction.

As illustrated in FIG. 11A, the coil opening OP of the power supply coil 31 overlaps the notch SL6A.

An antenna according to the present preferred embodiment includes the power supply coil 31 and the notch SL6A that overlaps the coil opening OP of the power supply coil 31. This structure enables the same or substantially the same advantageous effects as in the above-described electronic device 206 to be provided.

Although each heat spreader described according to the above-described preferred embodiments by way of example is rectangular or substantially rectangular in a plan view, the heat spreader is not limited thereto. The shape of the heat spreader in a plan view may be appropriately changed provided that the advantageous effects of the present invention are provided and may be, for example, a polygonal shape, a circular shape, an ellipse shape, an L-shape, a T-shape, or a crank shape.

Although each heat spreader described according to the above-described preferred embodiments by way of example includes the projections 7 and the pillars 5, the heat spreader is not limited thereto. A known heat spreader (vapor chamber) is also acceptable.

The shape of the operational region WE (the enclosed space E1) in a plan view is not limited to the shapes according to the above-described preferred embodiments. The shape of the enclosed space E1 in a plan view may be appropriately changed provided that the advantageous effects of the present invention are provided. However, the shape of the enclosed space E1 in a plan view is preferably a simple shape, such as a rectangular or substantially rectangular shape.

The shape, position, and number of each notch may also be appropriately changed provided that the advantageous effects of the present invention are provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
an antenna; and
a plate-shaped heat spreader including a first metal layer and a second metal layer that are stacked, a working fluid in an enclosed space interposed between the first metal layer and the second metal layer, and a joint along which outer peripheral portions around the enclosed space are joined, wherein
the heat spreader includes an operational region in which the enclosed space is located and a quasi-operational region other than the enclosed space,
the antenna is provided in the quasi-operational region in a plan view of the heat spreader,
at least a portion of the quasi-operational region is located in a nonconductive area in which a conductor density is lower than that of another area in a plan view of the heat spreader,
the antenna is provided in the portion of the quasi-operational region that is located in the nonconductive area,
the heat spreader includes a bent portion in the portion of the quasi-operational region that is located in the nonconductive area, and
the bent portion is a portion of the antenna.

2. The electronic device according to claim 1, wherein the nonconductive area is a non-ground area in which no ground conductor is provided.

3. The electronic device according to claim 1, wherein at least a portion of the operational region is located in the nonconductive area in a plan view of the heat spreader.

4. The electronic device according to claim 1, wherein the antenna is a standing-wave antenna that is used in a UHF band.

5. An electronic device comprising:
an antenna; and
a plate-shaped heat spreader including a first metal layer and a second metal layer that are stacked, a working fluid in an enclosed space interposed between the first metal layer and the second metal layer, and a joint along which outer peripheral portions around the enclosed space are joined, wherein
the heat spreader includes an operational region in which the enclosed space is located and a quasi-operational region other than the enclosed space,
the antenna is provided in the quasi-operational region in a plan view of the heat spreader,
at least a portion of the quasi-operational region is located in a nonconductive area in which a conductor density is lower than that of another area in a plan view of the heat spreader,
the antenna is provided in the portion of the quasi-operational region that is located in the nonconductive area,
the heat spreader includes a notch in the portion of the quasi-operational region that is located in the nonconductive area, and
the notch is a portion of the antenna.

6. The electronic device according to claim 5, wherein the notch is provided in a portion of the first metal layer that is not stacked with the second metal layer.

7. The electronic device according to claim 5, further comprising:
a power supply coil that includes a coil opening; wherein the antenna is a magnetic-field antenna that is used in a HF band and that includes the power supply coil and the notch that overlaps the coil opening.

8. The electronic device according to claim 5, wherein the notch has an L shape.

9. The electronic device according to claim 5, wherein the notch extends through the first metal layer and the second metal layer.

10. The electronic device according to claim 5, wherein a power supply circuit is connected at a position of the notch.

11. The electronic device according to claim 5, wherein the antenna is a slot antenna defined by the notch.

12. The electronic device according to claim 5, wherein the notch extends inward from an outer edge of the heat spreader.

13. The electronic device according to claim 5, wherein a size of the first metal layer is different from a size of the second metal layer.

14. The electronic device according to claim 5, wherein the nonconductive area is a non-ground area in which no ground conductor is provided.

15. The electronic device according to claim 5, wherein at least a portion of the operational region is located in the nonconductive area in a plan view of the heat spreader.

16. An electronic device comprising:
an antenna; and
a plate-shaped heat spreader including a first metal layer and a second metal layer that are stacked, a working fluid in an enclosed space interposed between the first metal layer and the second metal layer, and a joint along which outer peripheral portions around the enclosed space are joined, wherein
the heat spreader includes an operational region in which the enclosed space is located and a quasi-operational region other than the enclosed space,
the antenna is provided in the quasi-operational region in a plan view of the heat spreader,
the heat spreader includes pillars in the enclosed space between the first metal layer and the second metal layer, and
the heat spreader includes projections provided on a surface of the second metal layer in the enclosed space and extending toward the first metal layer.

17. The electronic device according to claim 16, wherein the pillars are made of a same material as the first metal layer and the second metal layer.

18. The electronic device according to claim 16, wherein the heat spreader includes a wick disposed between the pillars and the projections.

19. The electronic device according to claim 18, wherein the wick has a plate shape.

* * * * *